(12) United States Patent
Schneider et al.

(10) Patent No.: US 8,392,779 B2
(45) Date of Patent: Mar. 5, 2013

(54) INTERFACE VOLTAGE ADJUSTMENT BASED ON ERROR DETECTION

(75) Inventors: Andreas Schneider, Munich (DE); Markus Balb, Unterhaching (DE); Thomas Hein, Munich (DE); Christoph Bilger, Munich (DE); Martin Brox, Munich (DE); Peter Gregorius, Munich (DE); Michael Richter, Ottobrunn (DE)

(73) Assignee: Qimonda AG, Munich (DE)

( * ) Notice: Subject to any disclaimer, the term of this patent is extended or adjusted under 35 U.S.C. 154(b) by 1111 days.

(21) Appl. No.: 12/109,826

(22) Filed: Apr. 25, 2008

(65) Prior Publication Data

US 2009/0271678 A1 Oct. 29, 2009

(51) Int. Cl.
*G06F 11/00* (2006.01)
*G06F 11/30* (2006.01)
*G08C 25/00* (2006.01)
*H03M 13/00* (2006.01)

(52) U.S. Cl. ........ 714/746; 714/752; 714/758; 714/805; 714/708; 365/185.09; 323/315

(58) Field of Classification Search .................. 714/752, 714/758, 805, 708; 365/185.09; 323/315
See application file for complete search history.

(56) References Cited

U.S. PATENT DOCUMENTS

| | | | | |
|---|---|---|---|---|
| 4,706,249 A | * | 11/1987 | Nakagawa et al. | 714/773 |
| 2002/0144210 A1 | * | 10/2002 | Borkenhagen et al. | 714/805 |
| 2005/0024035 A1 | * | 2/2005 | Tabaian et al. | 323/315 |
| 2005/0149824 A1 | * | 7/2005 | Arnez et al. | 714/758 |
| 2007/0050695 A1 | * | 3/2007 | Schulz | 714/752 |
| 2007/0174642 A1 | * | 7/2007 | Cornwell et al. | 713/300 |
| 2007/0201274 A1 | * | 8/2007 | Yu et al. | 365/185.09 |
| 2008/0266984 A1 | * | 10/2008 | Chen et al. | 365/189.02 |
| 2008/0273393 A1 | * | 11/2008 | Chen et al. | 365/185.21 |
| 2009/0161442 A1 | * | 6/2009 | New et al. | 365/189.04 |
| 2009/0210776 A1 | * | 8/2009 | Cho et al. | 714/805 |

OTHER PUBLICATIONS

Ernst, "Razor: A low-power Pipeline Based on Circuit-Level Timing Speculation", 2003, IEEE, pp. 1-12.*
Electronic Industries Alliance publication entitled "I/O Drivers and Receivers with Configurable Communication Voltage, Impedance, and Receiver Threshold"; Feb. 1999; 15 pgs.
NVIDIA Corporation article entitled "I.MX31L Multimedia Applications"; 2006; 2 pgs.
NVIDIA Coporation web page article entitled "PowerMizer Mobile Technology"; available at http://www.nvidia.com/object/feature_powermizer.html; 2008; 1 pg.
QIMONDA brochure entitled "Qimonda GDDR5—White Paper"; Aug. 2007; 10 pgs.
NVIDIA Corporation brochure entitled "Technical Brief PowerMizer 7.0"; May 2007; 21 pgs.

* cited by examiner

*Primary Examiner* — Scott Baderman
*Assistant Examiner* — Jeison C Arcos
(74) *Attorney, Agent, or Firm* — Dicke, Billig & Czaja, PLLC

(57) ABSTRACT

A method of adjusting an interface voltage includes transferring data between a memory device and a controller, and detecting whether an error occurred in the transfer of data. An interface voltage of at least one of the memory device and the controller is adjusted based on the detection.

20 Claims, 3 Drawing Sheets

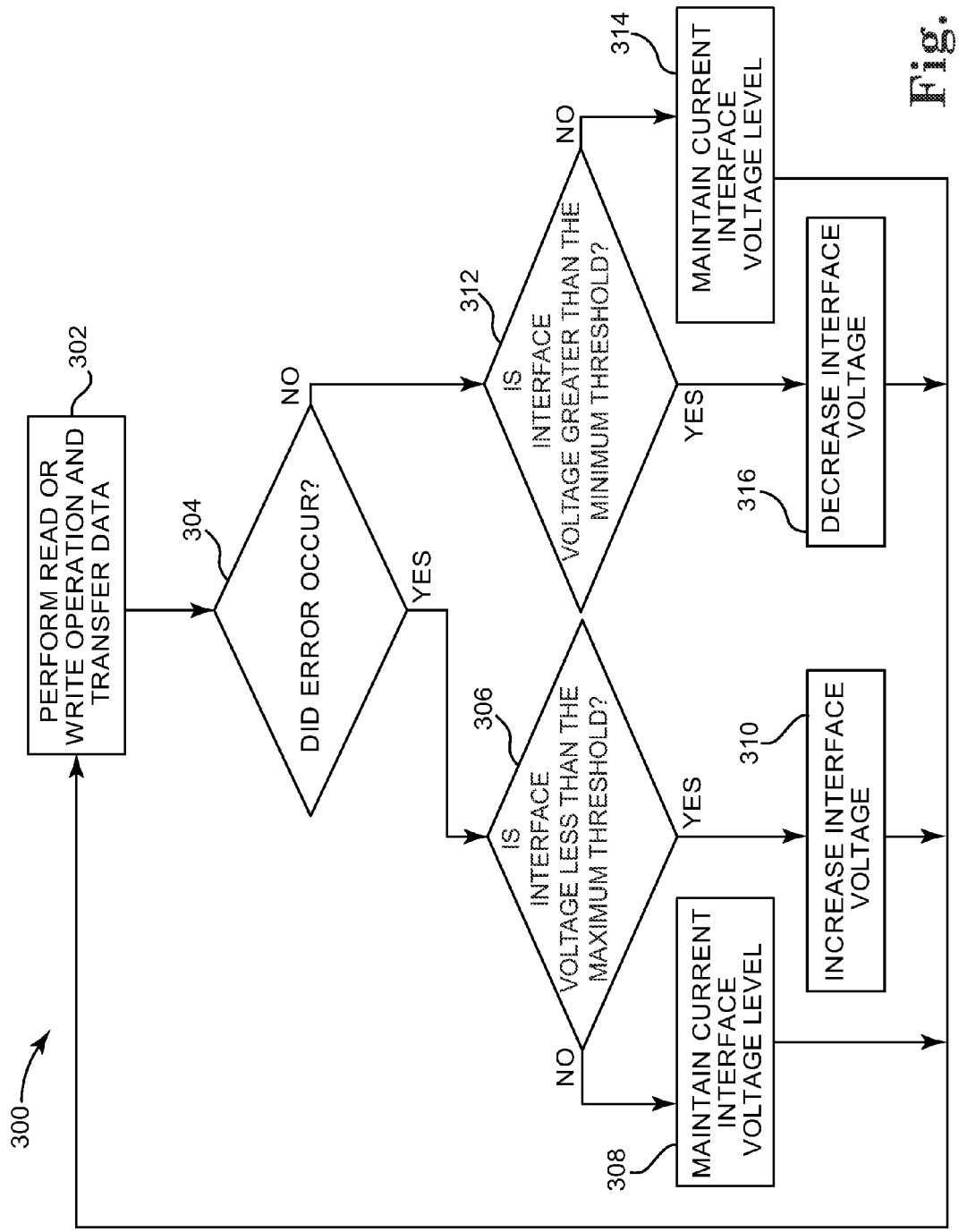

INTERFACE VOLTAGE ADJUSTMENT BASED ON ERROR DETECTION

BACKGROUND

Typically, an electronic system includes a number of integrated circuit chips that communicate with one another to perform system applications. Often, the electronic system includes a controller, such as a micro-processor, and one or more memory chips, such as random access memory (RAM) chips. The controller communicates with the memory to store data and to read the stored data.

The RAM chips can be any suitable type of RAM, such as dynamic RAM (DRAM) including single data rate synchronous DRAM (SDR-SDRAM), double data rate SDRAM (DDR-SDRAM), graphics DDR-SDRAM (GDDR-SDRAM), low power SDR-SDRAM (LPSDR-SDRAM), and low power DDR-SDRAM (LPDDR-SDRAM). Also, the RAM chips can be any suitable generation of memory including fourth generation DDR-SDRAM (DDR4-SDRAM), fifth generation GDDR-SDRAM (GDDR5-SDRAM), and higher generations of memory. Usually, each new generation of memory operates at an increased clock speed and/or an increased data rate from the previous generation.

In some existing electronic systems, a controller regulates the interface voltage of the controller and a memory based on a current mode of operation of the system. For example, some systems use dynamic voltage scaling (DVS), which involves scaling voltages down for lower power modes and scaling voltages up for higher power modes. DVS is typically performed in combination with a frequency change. Thus, when the voltage is scaled down, the frequency is also scaled down, and when the voltage is scaled up, the frequency is also scaled up.

SUMMARY

One embodiment provides a method of adjusting an interface voltage. The method includes transferring data between a memory device and a controller, and detecting whether an error occurred in the transfer of data. An interface voltage of at least one of the memory device and the controller is adjusted based on the detection.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 is flow diagram illustrating a method of controlling the interface voltage of a controller and a memory device according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
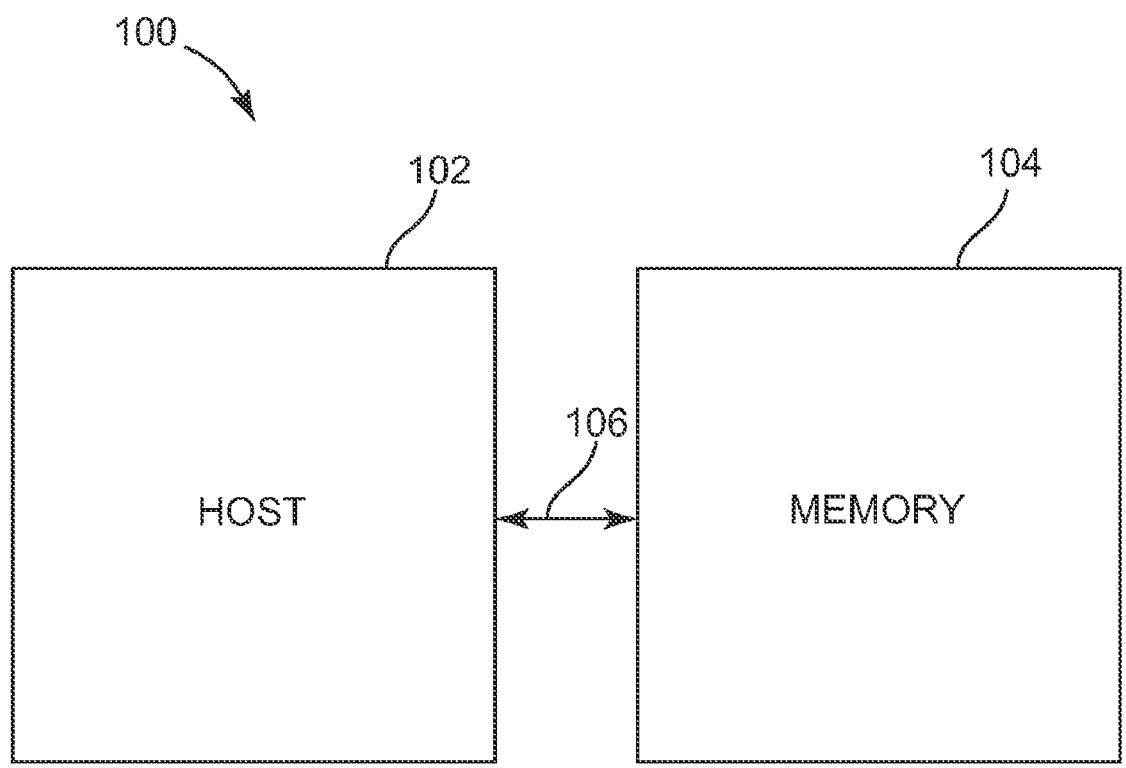
FIG. 1 is a block diagram illustrating a system with a memory according to one embodiment.

FIG. 1 is a block diagram illustrating a system 100 according to one embodiment. System 100 includes a host 102 and a memory 104. Host 102 is communicatively coupled to memory 104 through communication link 106. Host 102 includes a computer (e.g., desktop, laptop, handheld), portable electronic device (e.g., cellular phone, personal digital assistant (PDA), MP3 player, video player, digital camera), or any other suitable device that uses memory. Memory 104 provides data storage for host 102.

Figure 2:
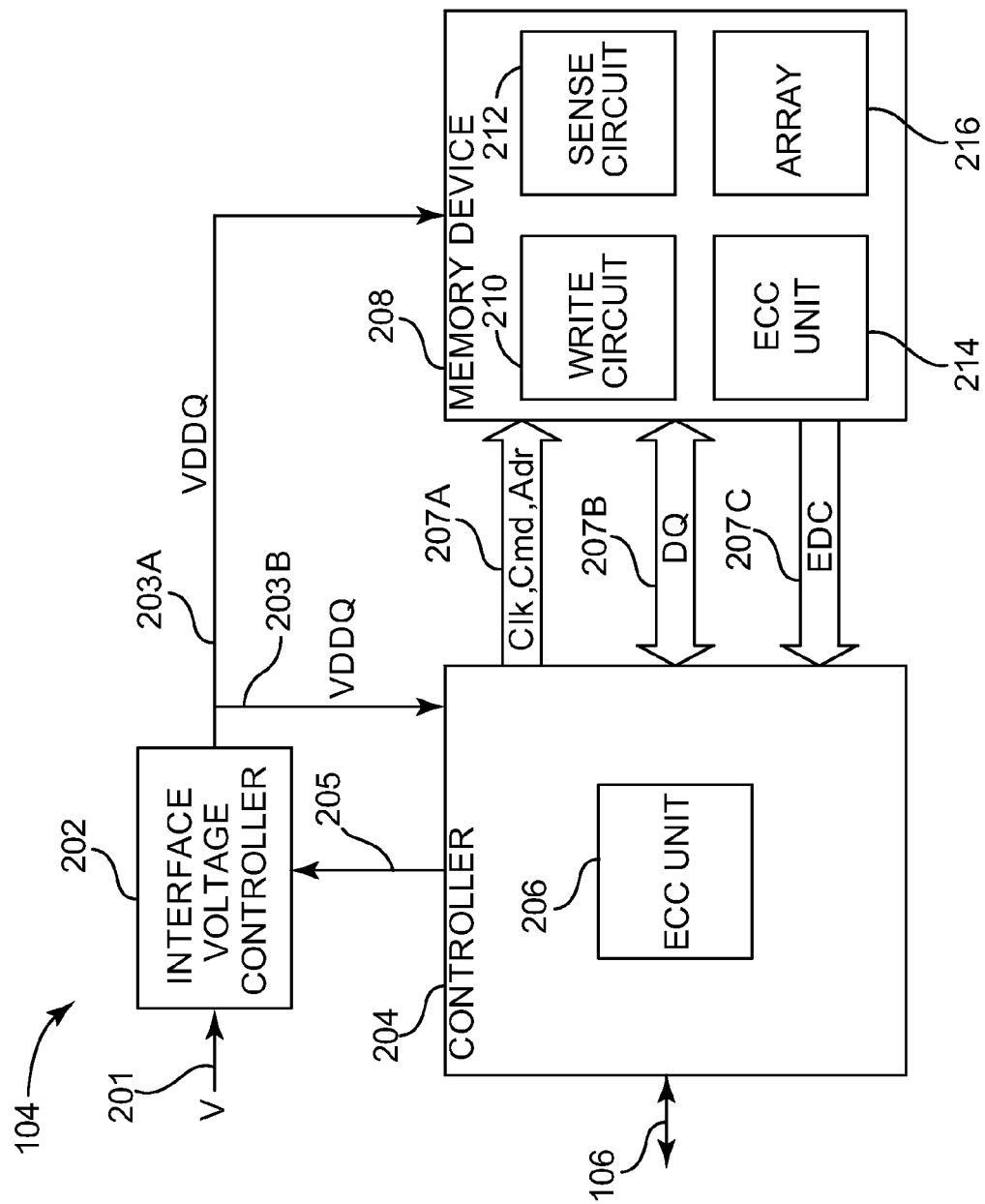
FIG. 2 is a block diagram illustrating a memory according to one embodiment.

FIG. 2 is a block diagram illustrating a memory 104 according to one embodiment. Memory 104 includes interface voltage controller or interface voltage regulator 202, controller 204, and memory device 208. In one embodiment, controller 204 and memory device 208 are separate integrated circuit chips, or in separate integrated chips. In another embodiment, controller 204 and memory device 208 are in the same integrated circuit chip. In one embodiment controller 204 comprises a central processing unit (CPU) or a graphics processing unit (GPU). Controller 204 includes an error correction code (ECC) unit 206. In one embodiment, memory device 208 is a dynamic random access memory (DRAM) device. Memory device 208 includes write circuit 210, sense circuit 212, ECC unit 214, and memory array 216. In one embodiment, memory array 216 includes a plurality of memory cells, a plurality of word lines, and a plurality of bit lines. Each memory cell is electrically coupled to a word line and a bit line.

As used herein, the term "coupled" is not meant to mean that the elements must be directly coupled together and intervening elements may be provided between the "coupled" elements.

Interface voltage controller 202 receives a supply voltage V through path 201. Interface voltage controller 202 generates an interface voltage (also referred to as a communication voltage or an input/output (I/O) voltage) VDDQ, and provides the interface voltage VDDQ to memory device 208 and controller 204 through paths 203A and 203B, respectively. In one embodiment, the interface voltage VDDQ is less than or equal to the supply voltage V. Controller 204 is electrically coupled to interface voltage controller through path 205. In one embodiment, controller 204 is configured to send voltage control information to interface voltage controller 202 via path 205, and thereby cause voltage controller 202 to modify the interface voltage VDDQ.

Controller 204 is communicatively coupled to memory device 208 through communication links 207A-207C (collectively referred to as communication links 207). In one embodiment, communication links 207A-207C each include a plurality of signal paths. Controller 204 is configured to send clock (Clk), command (Cmd), and address (Adr) signals to memory device 208 through communication link 207A. Controller 204 is configured to write or read data (DQ) to or from memory device 208 through communication link 207B.

Controller 204 is configured to receive error correction code (ECC) or error detection code (EDC) information from memory device 208 through signal path 207C. In one embodiment, controller 204 and memory device 208 are configured to use the interface voltage VDDQ for communications on communication links 207.

Controller 204 includes a microprocessor, microcontroller, or other suitable logic circuitry for controlling the operation of memory device 208. Controller 204 controls read and write operations of memory device 208, including the application of control and data signals to memory array 216 through write circuit 210 and sense circuit 212.

For a write operation according to one embodiment, memory device 208 receives data to write to memory array 216 from controller 204 through communication link 207B. ECC unit 214 in memory device 208 generates ECC information (e.g., parity or checksum information) for the received data and outputs the ECC information to controller 204 through communication link 207C. Write circuit 210 writes the received data to memory array 216.

For a read operation according to one embodiment, sense circuit 212 reads data from the memory array 216. ECC unit 214 in memory device 208 generates ECC information (e.g., parity or checksum information) for the data read from memory array 216 and outputs the ECC information to controller 204 through communication link 207C. Memory device 208 transmits the data read from memory array 216 to controller 204 through communication link 207B.

As mentioned above, ECC unit 206 in controller 204 receives ECC information from memory device 208 for read and write operations. In one embodiment, ECC unit 214 calculates an 8-bit checksum for each 72-bit data burst, and returns the checksum to controller 204 through a dedicated error detection communication link 207C. ECC unit 206 in controller 204 uses a CRC algorithm in one embodiment to decode the received checksum information and detect whether any bit failures occurred during a read or write operation.

In one embodiment, for read operations, ECC unit 206 corrects bit failures within data read from memory device 208, and controller 204 outputs the corrected data to host 102 via communication link 106. In one embodiment, ECC decoder 206 is configured to detect and correct single-bit or double-bit failures within a 72-bit data burst from memory device 208. If ECC unit 206 detects any failure for a write operation, or detects a failure for a read operation that can not be corrected, controller 204 causes the operation that caused the error to be repeated in one embodiment. ECC units 206 and 214 are configured in one embodiment to provide fast (e.g., close to real-time) error detection of transmission errors that occur on the controller/memory interface signal lines, which allows data to be quickly retransmitted.

In one embodiment, controller 204 is configured to periodically adjust the interface voltage VDDQ based on error detection results. If the ECC unit 206 does not detect any errors (or detects less than a threshold number of errors) for a predetermined time duration, controller 204 sends voltage control information to interface voltage controller 202 via path 205 in one embodiment, which causes voltage controller 202 to decrease the interface voltage VDDQ. In one embodiment, controller 204 is configured to cause the interface voltage VDDQ to be decreased in predefined steps (e.g., 0.1 volts) until a failure is detected by ECC unit 206, or until a minimum threshold interface voltage is reached.

If the ECC unit 206 detects an error (or detects greater than a threshold number of errors during a predetermined time duration), controller 204 sends voltage control information to interface voltage controller 202 via path 205 in one embodiment, which causes voltage controller 202 to increase the interface voltage VDDQ. In one embodiment, controller 204 is configured to cause the interface voltage VDDQ to be increased in steps (e.g., 0.1 volts), until no failures are detected by ECC unit 206, or until a maximum threshold interface voltage is reached (e.g., to prevent damage of the controller 204 and the memory device 208).

FIG. 3 is flow diagram illustrating a method 300 of controlling the interface voltage VDDQ of a controller 204 and a memory device 208 according to one embodiment. At 302, the controller 204 performs a read operation or a write operation, and data is transferred between memory device 208 and controller 204. At 304, controller 204 detects whether an error occurred during the transfer of data at 302. In one embodiment, controller 204 detects whether an error occurred at 304 based on a checksum for the transferred data that is calculated by memory device 208 and transmitted to controller 204. If controller 204 determines at 304 that an error occurred during the transfer of data, the method 300 moves to 306.

At 306 in method 300, controller 204 determines whether the current interface voltage VDDQ is less than the maximum threshold interface voltage. If controller 204 determines at 306 that the current interface voltage VDDQ is not less than the maximum threshold interface voltage, the method 300 moves to 308. At 308, controller 204 maintains the current interface voltage level (e.g., controller 204 does not send any voltage control information to interface voltage controller 202 via path 205 that would cause the voltage controller 202 to change the interface voltage VDDQ), and the method 300 returns to 302. If controller 204 determines at 306 that the current interface voltage VDDQ is less than the maximum threshold interface voltage, the method 300 moves to 310. At 310, voltage controller 202 increases the interface voltage VDDQ (e.g., controller 204 sends voltage control information to interface voltage controller 202 via path 205, which causes voltage controller 202 to increase the interface voltage VDDQ).

Returning to 304 in method 300, if controller 204 determines at 304 that an error did not occur during the transfer of data, the method 300 moves to 312. At 312, controller 204 determines whether the current interface voltage VDDQ is greater than the minimum threshold interface voltage. If controller 204 determines at 312 that the current interface voltage VDDQ is not greater than the minimum threshold interface voltage, the method 300 moves to 314. At 314, controller 204 maintains the current interface voltage level (e.g., controller 204 does not send any voltage control information to interface voltage controller 202 via path 205 that would cause the voltage controller 202 to change the interface voltage VDDQ), and the method 300 returns to 302. If controller 204 determines at 312 that the current interface voltage VDDQ is greater than the minimum threshold interface voltage, the method 300 moves to 316. At 316, voltage controller 202 decreases the interface voltage VDDQ (e.g., controller 204 sends voltage control information to interface voltage controller 202 via path 205, which causes voltage controller 202 to decrease the interface voltage VDDQ).

One embodiment provides a system and method that adjusts or switches the interface voltage of at least one of a controller and a memory device based on the detection of failures or interface errors in data transfers between the controller and the memory device. In one embodiment, the interface voltage for the controller is adjusted based on the error detection. In another embodiment, the interface voltage for the memory device is adjusted based on the error detection. In yet another embodiment, the interface voltage for both the memory device and the controller is adjusted based on the error detection. The adjustment of the interface voltage according to one embodiment results in lower power consumption for the interface between the controller and the memory device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of adjusting an interface voltage, the method comprising:
    transferring data between a memory device and a controller;
    detecting whether an error occurred in the transfer of data; and
    adjusting an interface voltage of at least one of the memory device and the controller based on the detection of whether an error occurred in the transfer of data and based on a threshold number of errors.

2. The method of claim 1, and further comprising:
    adjusting the interface voltage of both the memory device and the controller based on the detection.

3. The method of claim 1, wherein adjusting an interface voltage comprises:
    decreasing the interface voltage when a number of detected errors during a predetermined time duration is less than the threshold number of errors.

4. The method of claim 1, wherein adjusting an interface voltage comprises:
    increasing the interface voltage when a number of detected errors during a predetermined time duration is greater than the threshold number of errors.

5. The method of claim 1, wherein detecting whether an error occurred comprises:
    generating a checksum with the memory device based on the data transferred between the memory device and the controller.

6. The method of claim 5, wherein detecting whether an error occurred further comprises:
    transmitting the checksum from the memory device to the controller.

7. The method of claim 6, wherein detecting whether an error occurred further comprises:
    detecting whether an error occurred in the transfer of data with the controller based on the transmitted checksum.

8. An electronic system, comprising:
    a memory device including an array of memory cells;
    a controller communicatively coupled to the memory device;
    a first error correction code (ECC) unit configured to generate ECC information based on data transferred between the memory device and the controller; and
    wherein the controller is configured to adjust an interface voltage of at least one of the memory device and the controller based on the ECC information.

9. The electronic system of claim 8, wherein the controller is configured to detect errors in the transferred data based on the ECC information.

10. The electronic system of claim 9, wherein the controller is configured to decrease the interface voltage when a number of detected errors during a predetermined time duration is less than a threshold number of errors.

11. The electronic system of claim 9, wherein the controller is configured to increase the interface voltage when a number of detected errors during a predetermined time duration is greater than a threshold number of errors.

12. The electronic system of claim 8, wherein the ECC information is a checksum.

13. The electronic system of claim 8, wherein the first ECC unit is contained in the memory device.

14. The electronic system of claim 13, wherein the first ECC unit is configured to generate the ECC information for a write operation based on data received from the controller, and transmit the ECC information to the controller.

15. The electronic system of claim 13, wherein the first ECC unit is configured to generate the ECC information for a read operation based on data read from the array, and transmit the ECC information to the controller.

16. The electronic system of claim 8, and further comprising a second ECC unit contained in the controller and configured to detect and correct errors in data read from the array based on the ECC information.

17. The electronic system of claim 8, and further comprising a second ECC unit contained in the controller and configured to detect errors in data written to the array based on the ECC information.

18. The electronic system of claim 17, wherein the controller is configured to cause a write operation to be repeated when the second ECC unit detects an error in data written to the array.

19. The electronic system of claim 8, wherein the memory device is a DRAM device.

20. An electronic system comprising:
    a memory device comprising:
        an array of memory cells; and
        an error correction code (ECC) unit configured to generate checksums for read and write operations and output the checksums; and
    a controller communicatively coupled to the memory device, the controller configured to perform error detection on data transferred between the controller and the memory device based on the checksums output by the memory device, the controller configured to adjust an interface voltage of at least one of the controller and the memory device based on the detected errors.

* * * * *